United States Patent
Yang et al.

(10) Patent No.: US 8,054,126 B2
(45) Date of Patent: Nov. 8, 2011

(54) DYNAMIC BIAS SUPPLY DEVICES

(75) Inventors: Youngoo Yang, Suwon-si (KR); Min-Su Kim, Bucheon-si (KR)

(73) Assignee: Sungkyunkwan University Foundation for Corporate Collaboration, Gyeonggi-do (KR)

( * ) Notice: Subject to any disclaimer, the term of this patent is extended or adjusted under 35 U.S.C. 154(b) by 0 days.

(21) Appl. No.: 12/705,208

(22) Filed: Feb. 12, 2010

(65) Prior Publication Data

US 2011/0018628 A1  Jan. 27, 2011

(30) Foreign Application Priority Data

Jul. 23, 2009 (KR) .......................... 10-2009-0067212

(51) Int. Cl.
*H03F 3/68* (2006.01)
(52) U.S. Cl. ................................. 330/124 R; 330/295
(58) Field of Classification Search ............ 330/124 R, 330/295, 296, 285, 297
See application file for complete search history.

(56) References Cited

U.S. PATENT DOCUMENTS

| 5,438,684 | A | * | 8/1995 | Schwent et al. | ............ 455/552.1 |
| 6,093,981 | A | * | 7/2000 | Cali' et al. | .................... 307/113 |
| 7,486,136 | B2 | * | 2/2009 | Bakalski et al. | .......... 330/124 R |
| 7,893,770 | B2 | * | 2/2011 | Yamauchi et al. | ............ 330/295 |

FOREIGN PATENT DOCUMENTS

| KR | 10-0306722 | 9/2001 |
| KR | 10-0560613 | 3/2006 |

* cited by examiner

*Primary Examiner* — Henry Choe
(74) *Attorney, Agent, or Firm* — Harness, Dickey & Pierce, P.L.C.

(57) ABSTRACT

A dynamic bias supply device for multiple parallel power amplifiers, in which a plurality of parallel power amplifiers including a Doherty amplifier are connected in parallel, is provided. The dynamic bias supply device includes a plurality of switches respectively corresponding to each of the parallel power amplifiers. The dynamic bias supply device is used in a distributed manner as multiple distributed dynamic bias switching circuits for the multiple parallel power amplifiers. Accordingly, performance deterioration is not caused by an additional connection structure, and it is possible to achieve high efficiency and high linearity of the power amplifiers.

6 Claims, 5 Drawing Sheets

DYNAMIC BIAS SUPPLY DEVICES

CLAIM FOR PRIORITY

This application claims priority to Korean Patent Application No. 10-2009-67212 filed on Jul. 23, 2009 in the Korean Intellectual Property Office (KIPO), the entire contents of which are hereby incorporated by reference.

BACKGROUND

1. Technical Field

Example embodiments of the present invention relate in general to devices for providing bias to a base station power amplifier or a terminal power amplifier used for high efficiency and high linearity in radio communications.

2. Related Art

Various circuits and devices for dynamic bias of power amplifiers are known. Such a dynamic bias switching circuit switches dynamic bias to a power amplifier.

FIG. 1 is a block diagram of a general dynamic bias switching device.

FIG. 1 illustrates an example of the structure of a device conventionally suggested to supply dynamic bias to a power amplifier. The device provides an input signal to a main path (a limiter 20, a delayer 30, and a main amplifier 40) and a bias path (an envelope signal detector 50, an envelope signal processor/switch unit 60) through a splitter.

In general, an input signal has magnitude and phase information. A splitter 10 splits the input signal into two signals and provides the two signals to a limiter 20 and an envelope signal detector 50, respectively.

In the main path, the limiter 20 extracts a phase signal from the magnitude and phase information included in the input signal, and a delayer 30 synchronizes a switching operation in which a signal to be input to a main amplifier 40 is transferred to the main amplifier 40 by an envelope signal processor/switch unit 60. The processed signal is provided to the main amplifier 40. The main amplifier 40 receives and amplifies the output signal of the delayer 30 to a desired magnitude.

In the bias path, when the input signal is received from the splitter 10, the envelope signal detector 50 detects magnitude and phase signals from the input signal as an envelope signal and provides the envelope signal to the envelope signal processor/switch unit 60. The envelope signal processor/switch unit 60 generates a dynamic signal having an appropriate signal level required for the switching operation in response to the envelope signal provided by the envelope signal detector 50. Also, the envelope signal processor/switch unit 60 applies bias voltage and current to the main amplifier 40 using the dynamic signal (a dynamically variable input magnitude and phase signal). When dynamic bias is supplied as the bias of the main amplifier 40, it is possible to achieve high linearity and high efficiency according to the dynamic bias.

Well-known dynamic bias supply devices include envelope elimination and restoration (EER) and hybrid EER devices. The EER device has the above-described constitution including a limiter. A non-linear amplifier is used as a main amplifier. Unlike the EER device, the hybrid EER device has a structure in which a main amplifier receives and uses an input signal as is without receiving a phase signal. Thus, the hybrid EER device has the constitution of FIG. 1 excluding a limiter. The structure is the same as the path of a main amplifier of an envelope tracking (ET) device, and a main amplifier of the dynamic bias supply device uses EER. For this reason, the structure is referred to as hybrid EER.

The conventional dynamic bias supply device of FIG. 1 can be implemented with an ET or dynamic-bias supply (DBS) device.

The ET and DBS devices each include a splitter, an envelope signal detector, a delayer, an envelope signal processor/switch unit, and a main amplifier. Since the constitution is similar to that of the dynamic bias supply device of FIG. 1, its detailed description will be omitted. The main amplifier uses an input signal as is, and an amplifier of a linear amplifier mode is used as the main amplifier. An envelope signal that is input to the envelope signal detector and converted into an appropriate dynamic level is input to the envelope signal processor/switch unit, and the envelope signal processor/switch unit supplies dynamic bias to the main amplifier using the input signal.

The DBS and ET devices operate in a similar way except that the DBS device does not supply bias according to a variable dynamic level. The DBS device sets an appropriate reference level, and supplies bias using a low output voltage and current level of a main amplifier when a dynamic level is below the reference level and using a high output voltage and current level of the main amplifier when a dynamic level is the reference level or above. In other words, the DBS device has a structure that supplies different bias voltages and currents according to dual or various reference voltage levels.

A Dual dynamic bias supply (DDBS) device is also a well-known dynamic bias supply device. The DDBS device operates in a similar way to the DBS device described above. The DDBS device does not receive an input signal through a splitter and does not detect and use an envelope signal. The DDBS device obtains a magnitude signal alone before a modem implemented by a digital signal processor (DSP) or field programmable gate array (FPGA) modulates the magnitude signal and a phase signal obtained by modulating the input signal into a radio frequency (RF) signal and immediately uses the magnitude signal. Thus, the DDBS device has a simpler structure than the DBS device.

Meanwhile, a power amplifier may consist of one power amplifier or a plurality of power amplifiers. The power amplifier consisting of a plurality of power amplifiers is referred to as multiple parallel power amplifiers.

Since multiple parallel power amplifiers include a plurality of power amplifiers, bias should be supplied to the power amplifiers.

In general, the dynamic bias switching circuit of multiple parallel power amplifiers has a structure in which one dynamic bias circuit is shared by all the multiple parallel power amplifiers.

FIG. 2 is a block diagram of a dynamic bias supply device for multiple parallel power amplifiers, particularly, parallel two-stage power amplifiers. The structure of the dynamic bias supply device is obtained by modifying the example of the amplifier constitution for achieving high efficiency and high linearity described with reference to FIG. 1 into two stages. An envelope signal processor/switch unit 140 includes an envelope signal processor 142 and a switch 144, and its description has been given with reference to FIG. 1.

Referring to FIG. 2, the dynamic bias supply device includes an input network 210 and an output network 230. The input network 210 and the output network 230 include matching circuits for matching the inputs and outputs of the networks and for matching multiple parallel power amplifiers, and an input/output (I/O) matching circuit of the amplifiers.

When the multiple parallel power amplifiers use a single dynamic bias supply device, along with a lines 220 through which bias is supplied from the switch 144, b lines 222, which are unnecessary, are included. When such unnecessary lines cause a mismatch between power amplifiers 224, the mismatch causes performance deterioration, such as a memory effect, non-linearity and efficiency deterioration, and high linearity and high efficiency are deteriorated.

In other words, many constitutions for dynamic bias supply as shown in FIG. 2 have been suggested and announced. However, when each of the constitutions is installed in multiple parallel power amplifiers as a single dynamic bias supply device, the constitution deteriorates high linearity and high efficiency.

SUMMARY

Accordingly, example embodiments of the present invention are provided to substantially obviate one or more problems due to limitations and disadvantages of the related art.

Example embodiments of the present invention provide multiple parallel power amplifiers employing a dynamic bias supply device having multiple switches to remove an unnecessarily generated performance deterioration factor and achieve high efficiency and high linearity of the power amplifiers.

In some example embodiments, a dynamic bias supply device for multiple parallel power amplifiers in which a plurality of parallel power amplifiers including a Doherty amplifier are connected in parallel, includes a plurality of switches respectively coupled to a corresponding power amplifier of the parallel power amplifiers.

The dynamic bias supply device may further include a plurality of envelope signal processors configured to generate a dynamic signal having a signal level required for the switches in response to an envelope signal and configured to provide the generated dynamic signal to the respective switches.

The dynamic bias supply device may further include one envelope signal processor configured to supply a dynamic signal for an envelope to the switches, and the one envelope signal processor may be commonly coupled to the switches.

The dynamic bias supply device may include at least one structure in which one envelope signal processor is coupled to each of the plurality of switches, and the at least one structure may be coupled in parallel to each of the plurality of power amplifiers. The dynamic bias supply device may be applied to any amplifier having a multiple parallel structure, the multiple parallel structure may include a balanced amplifier, a Doherty amplifier, a feed-forward amplifier, a feedback amplifier, and a polar transmitter.

The dynamic bias supply device may be applied to an envelope elimination and a restoration (EER), a hybrid-EER, an envelope tracking (ET), or a dynamic bias switching (DBS).

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS OF THE PRESENT INVENTION

Figure 1:
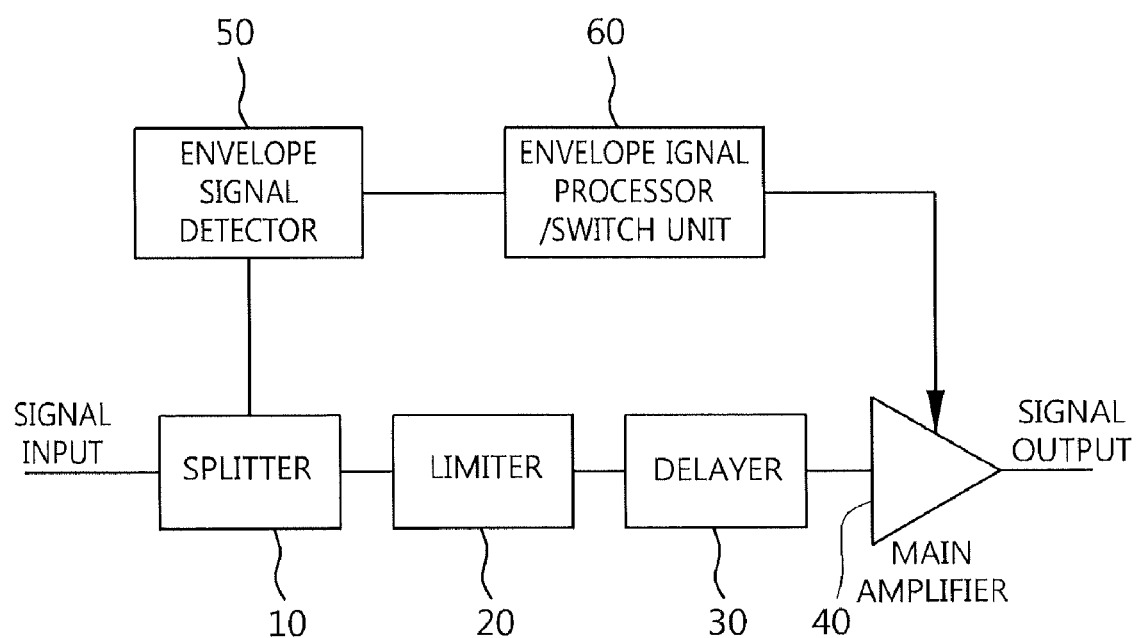
FIG. 1 is a block diagram of a general dynamic bias switching device.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the teem "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In case of a "unit" comprised of "A" and "B", the "unit" means not only one structure that includes "A" and "B", but also means that"A" and "B" may be removably secured each other.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Figure 3:
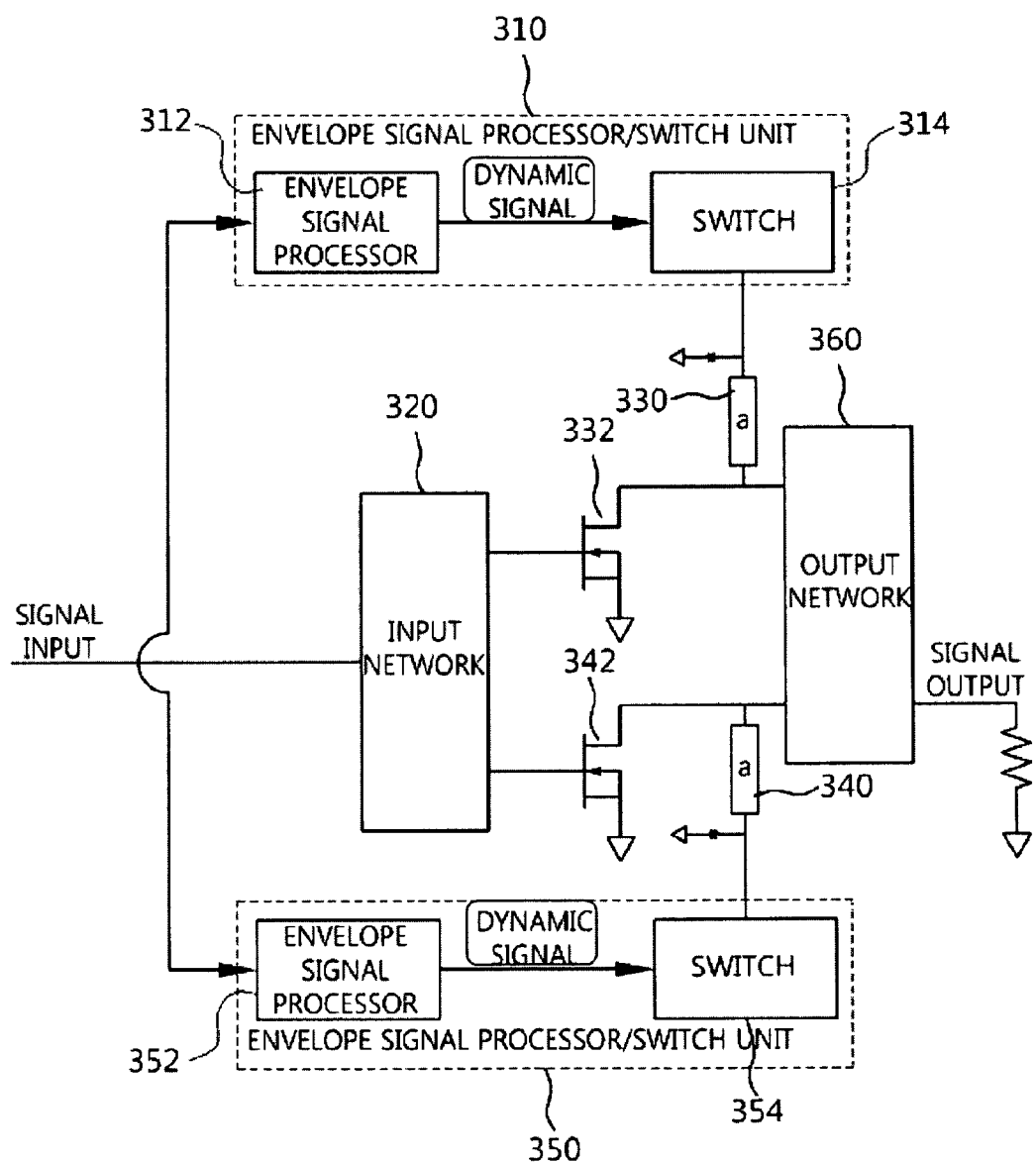
FIG. 3 is a block diagram of a dynamic bias supply device having a parallel two-stage structure according to example embodiments of the present invention.

FIG. 3 is a block diagram of a dynamic bias supply device having a parallel two-stage structure according to example embodiments of the present invention.

The multiple parallel structure shown in FIG. 3 includes all structures in which multiple amplifiers, such as a balanced amplifier, a Doherty amplifier, a feed-forward amplifier, a feedback amplifier, and a polar (or polar modulation) transmitter, are connected in parallel as well as the structure shown in FIG. 1. Also, a main amplifier 224 includes a device formed of any material used for amplification, such as a laterally diffused metal oxide semiconductor (LDMOS), GaN, and a field effect transistor (FET).

When the main amplifier 224 is a parallel two-stage power amplifier having two amplifiers 332 and 342, the dynamic bias supply device has multiple parallel two-stage switches.

Referring to FIG. 3, the dynamic bias supply device includes an input network 320 and an output network 360. The input network 320 and the output network 360 function to match multiple parallel connections, and respectively include a matching circuit that matches an input and output of the network and a matching circuit that matches an input and output of the amplifiers.

Envelope signal processors and parallel two-stage switches supply bias to the power amplifiers 332 and 342. To be specific, envelope signal processor/switch units 310 and 350 supply bias to the power amplifiers 332 and 342, respectively.

The envelope signal processor/switch units 310 and 350 include envelope signal processors 312 and 352 and switches 314 and 354, respectively.

The envelope signal processors 312 and 352 generate a dynamic signal having an appropriate signal level required for the switches 314 and 354 in response to a received envelope signal, and provide the generated dynamic signal to the switches 314 and 354.

To supply bias from the switches 314 and 354 to the power amplifiers 332 and 342, a line 330 is connected between the switch 314 and the power amplifier 332, and a line 340 is connected between the switch 354 and the power amplifier 342. 'a' lines 330 and 340 are bias supply lines.

'a' lines denote generally used λ/4 lines and include all structures capable of providing an inductor or bias. Also, a capacitor (not shown) may be connected between 'a' line 330 and the power amplifier 332 and between a line 340 and the power amplifier 342. The capacitor forms a radio frequency (RF) short connecting a second power to the ground, and its position may be changed. In other words, the capacitor denotes a generally known second short and a bypass device for bias.

The switches 314 and 354 apply a bias voltage and current to the respective power amplifiers 332 and 342 using a dynamic signal (a dynamically variable input magnitude and phase signal). Dynamic bias is supplied to the power amplifiers 332 and 342.

The switches 314 and 354 may include a bipolar junction transistor (BJT) having an emitter follower structure. When the BJT performs a switching operation, an input signal is switched according to a dynamic level output from an envelope signal processor. Also, the switches 314 and 354 include transistors, switches, etc., that are formed of any material through any process and conventionally used as switching devices. For example, the switches 314 and 354 may include all devices capable of switching such as a BJT and an n-type metal oxide semiconductor (NMOS) or p-type metal oxide semiconductor (PMOS) transistor.

As described above, the dynamic bias supply device of FIG. 3 according to an example embodiment of the present invention has envelope signal processors and parallel two-stage switches that respectively supply bias to a plurality of power amplifiers constituting a main amplifier.

Figure 2:
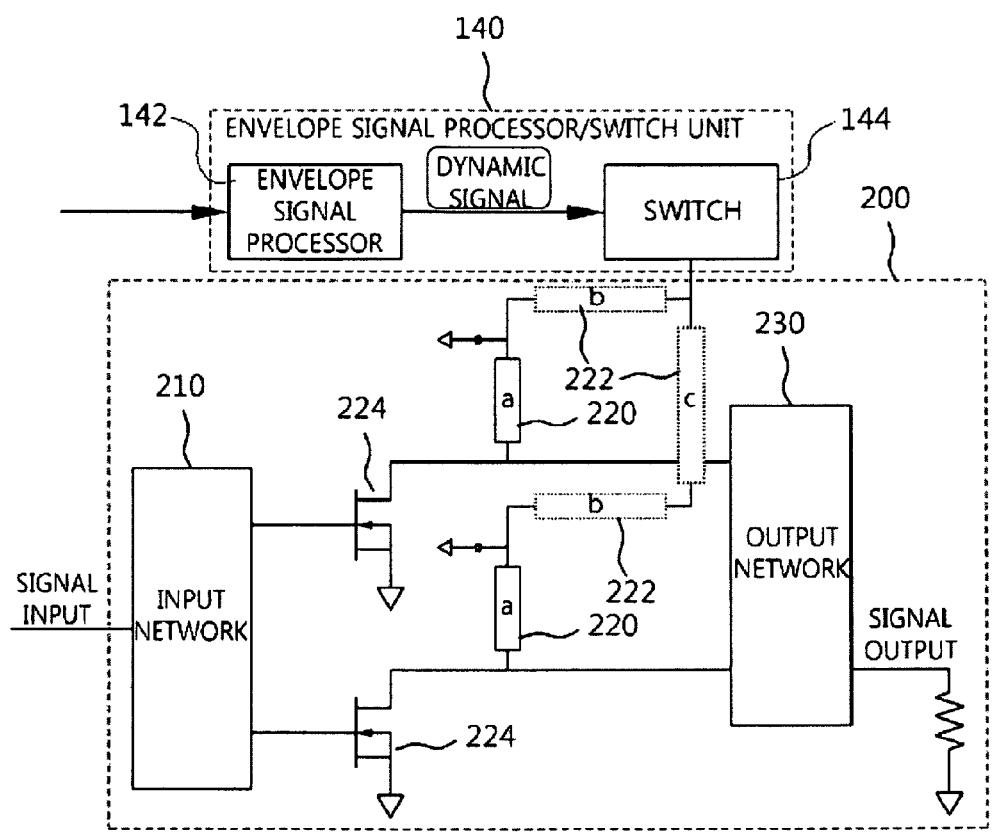
FIG. 2 is a block diagram of a dynamic bias supply device for multiple parallel power amplifiers, particularly, parallel two-stage power amplifiers.

Since the dynamic bias supply device according to an example embodiment of the present invention does not have b lines shown in FIG. 2 for supplying bias provided by a switch to a plurality of power amplifiers according to conventional art, a mismatch is not caused between the power amplifiers 332 and 342. As a result, performance deterioration such as a memory effect, non-linearity and efficiency deterioration does not occur.

In other words, since envelope signal processors and parallel two-stage switches are directly connected to power amplifiers, it is possible to achieve high linearity and high efficiency of a main amplifier by removing connection lines required for a structure.

Figure 4:
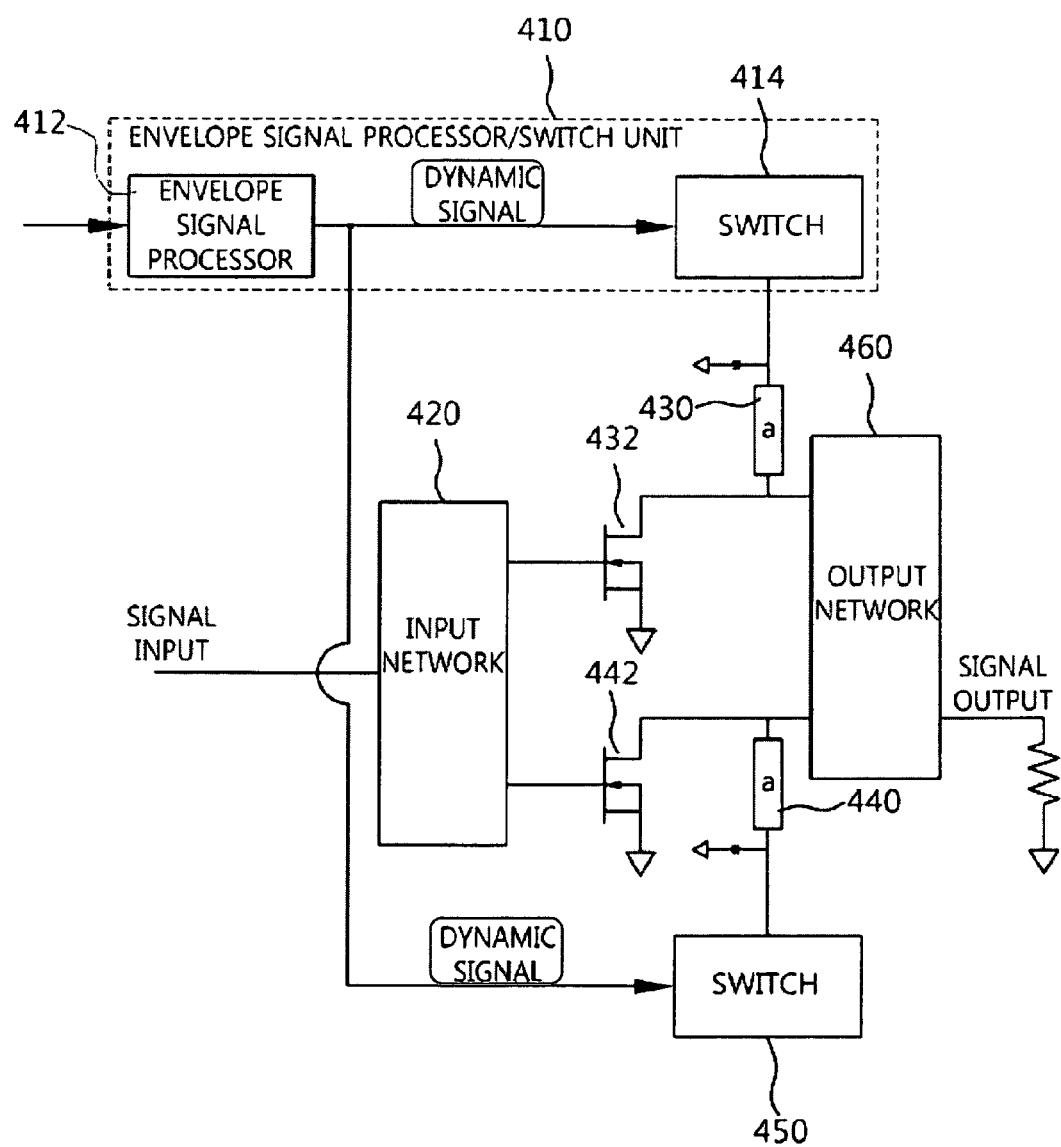
FIG. 4 is a block diagram of a dynamic bias supply device having a parallel two-stage structure according to other example embodiments of the present invention.

In FIG. 3, a plurality of structure in which an envelope signal processor 312 (or 352) is coupled to a switch 314 (or 354) is coupled in parallel to each of the plurality of power amplifiers 332 and 342, each structure supplies a bias to each of the plurality of power amplifiers 332 and 342. FIG. 4 is a block diagram of a dynamic bias supply device having a parallel two-stage structure according to other example embodiments of the present invention.

The dynamic bias supply device shown in FIG. 4 has a similar constitution to the dynamic bias supply device shown in FIG. 3, and its description has been given with reference to FIG. 3.

As shown in FIG. 4, a dynamic bias supply device having multiple switches can have a constitution in which an envelope signal processor not deteriorating performance of a main amplifier is used in common.

To be specific, in the dynamic bias supply device shown in FIG. 4, an envelope signal processor 412 is shared by a plurality of power amplifiers 342 and 442, unlike in the dynamic bias supply device shown in FIG. 3.

The envelope signal processor 412 generates a dynamic signal having an appropriate signal level required for switches 414 and 450 in response to a received envelope signal, and provides the dynamic signal to the respective switches 414 and 450.

To supply bias from the switches 414 and 450 to the power amplifiers 432 and 442, a lines 430 and 440 are connected between the switch 414 and the power amplifier 432 and between the switch 450 and the power amplifier 442.

Figure 5:
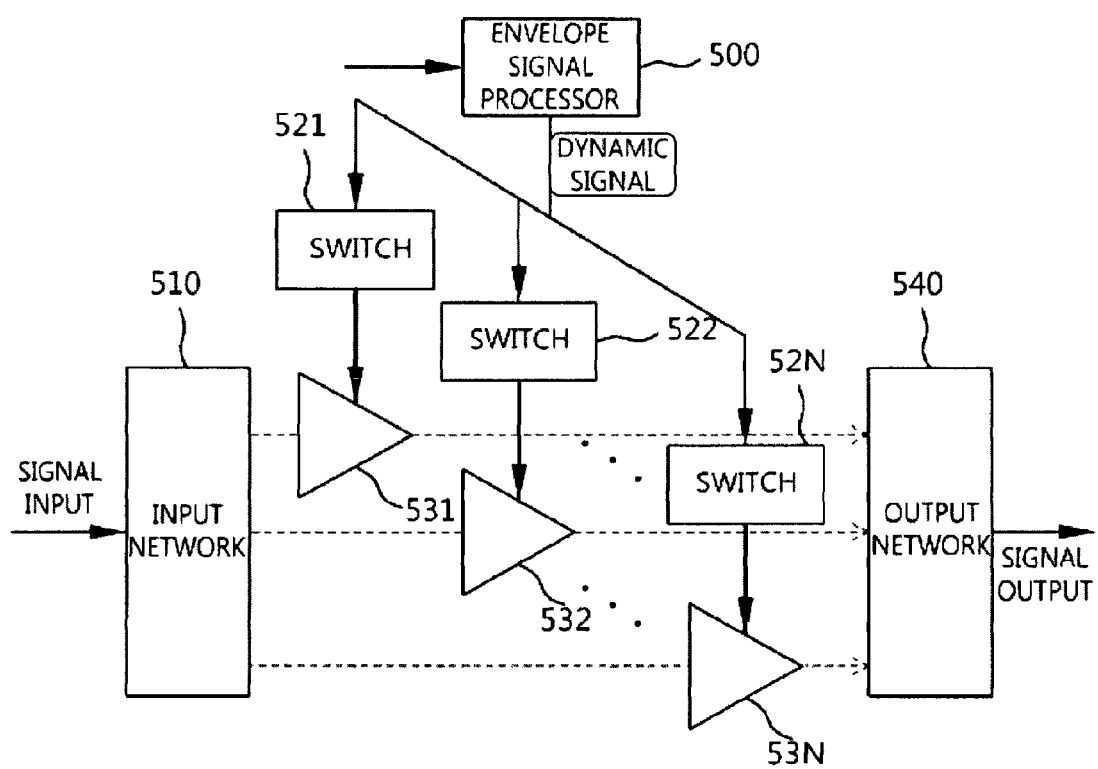
FIG. 5 is a schematic block diagram of a dynamic bias supply device for multiple parallel power amplifiers according to example embodiments of the present invention.

FIG. 5 is a schematic block diagram of a dynamic bias supply device for multiple parallel power amplifiers according to example embodiments of the present invention.

The dynamic bias supply device shown in FIG. 5 is an example in which multiple switches are connected in parallel to multiple parallel power amplifiers.

As shown in FIG. 5, an input signal is input to power amplifiers 531 to 53N through an input network 510, and switches 521 to 52N for providing bias to the respective power amplifiers 531 to 53N have the same numbers as the power amplifiers 531 to 53N.

When multiple parallel power amplifiers have an envelope signal processor and switches as shown in FIG. 5, it is possible to prevent performance deterioration caused by installing a single dynamic bias supply circuit. Thus, performance of the circuits of FIGS. 1 and 2 intended for high linearity and high efficiency may be maintained as high as possible.

Example embodiments of the present invention correspond to all structures that receive the magnitude and phase of an input signal of a power amplifier as an input of a dynamic bias circuit and supply bias to the power amplifier, and can be applied to power amplifiers having any multiple parallel structure in which a dynamic bias switching circuit can be installed for high efficiency and high linearity.

Even if the structure of FIG. 1 intended for high linearity and high efficiency of a power amplifier is applied to multiple parallel power amplifiers or a power amplifier of a terminal, a multiple parallel structure according to example embodiments of the present invention can maintain high efficiency and high linearity like a one-stage structure. Also, a dynamic bias supply device of a power amplifier according to example embodiments of the present invention can be applied to all techniques that require high efficiency and high linearity.

A dynamic bias supply device according to example embodiments of the present invention as described above is used in a distributed manner as multiple distributed dynamic bias switching circuits for multiple parallel power amplifiers. Thus, performance deterioration caused by an additional connection structure is prevented, and it is possible to achieve high efficiency and high linearity of the power amplifiers.

While the example embodiments of the present invention and their advantages have been described in detail, it should be understood that various changes, substitutions and alterations may be made herein without departing from the scope of the invention.

What is claimed is:

1. A dynamic bias supply device configured to supply bias to a plurality of parallel power amplifiers, the plurality of parallel power amplifiers including a Doherty amplifier, the dynamic bias supply device comprising:
a plurality of switches respectively coupled to a corresponding power amplifier of the plurality of parallel power amplifiers; and
at least one envelope signal processor configured to generate a dynamic signal in response to an envelope signal, the dynamic signal driving at least one the plurality of switches and the envelope signal corresponding to an input signal.

2. The dynamic bias supply device of claim 1, further comprising:
a plurality of envelope signal processors, wherein each envelope signal processor is configured to generate a respective dynamic signal in response to a respective envelope signal, the respective dynamic signal driving a respective switch of the plurality of switches.

3. The dynamic bias supply device of claim 1, wherein the at least one envelope signal processor is configured to supply the dynamic signal to the plurality of switches, the at least one envelope signal processor being commonly coupled to the plurality of switches.

4. The dynamic bias supply device of claim 3, including at least one structure having the at least one envelope signal processor commonly coupled to each of the plurality of switches, the at least one structure being coupled in parallel to each of the plurality of parallel power amplifiers.

5. The dynamic bias supply device of claim 1, further comprising:
a plurality of bias supply lines respectively connected between the plurality of switches and the plurality of parallel power amplifiers and configured to couple the bias from the switches to the power amplifiers, respectively.

6. The dynamic bias supply device of claim 5, the bias supply lines are $\lambda/4$ lines.

* * * * *